(12) United States Patent
Kim et al.

(10) Patent No.: US 10,923,326 B2
(45) Date of Patent: Feb. 16, 2021

(54) GAS SPRAYING APPARATUS FOR SUBSTRATE PROCESSING APPARATUS AND SUBSTRATE PROCESSING APPARATUS

(71) Applicant: JUSUNG ENGINEERING CO., LTD., Gwangju-si (KR)

(72) Inventors: Sung Bae Kim, Gwangju-si (KR); Cheong Son, Gwangju-si (KR)

(73) Assignee: JUSUNG ENGINEERING CO., LTD.

( * ) Notice: Subject to any disclaimer, the term of this patent is extended or adjusted under 35 U.S.C. 154(b) by 124 days.

(21) Appl. No.: 16/322,925

(22) PCT Filed: Aug. 24, 2017

(86) PCT No.: PCT/KR2017/009247
§ 371 (c)(1),
(2) Date: Feb. 1, 2019

(87) PCT Pub. No.: WO2018/048125
PCT Pub. Date: Mar. 15, 2018

(65) Prior Publication Data
US 2019/0157038 A1    May 23, 2019

(30) Foreign Application Priority Data
Sep. 6, 2016    (KR) .......................... 10-2016-0114515

(51) Int. Cl.
*H01J 37/32*    (2006.01)
*H05H 1/46*    (2006.01)
(Continued)

(52) U.S. Cl.
CPC .... *H01J 37/3244* (2013.01); *C23C 16/45559* (2013.01); *C23C 16/50* (2013.01);
(Continued)

(58) Field of Classification Search
CPC ............. H01J 37/3244; H01J 37/32541; H01J 37/32715; H01J 2237/20214;
(Continued)

(56) References Cited

U.S. PATENT DOCUMENTS

| 8,968,514 | B2 | 3/2015 | Do et al. | |
| 9,387,510 | B2 * | 7/2016 | Huh | ........................ B05D 3/044 |
| 2001/0047760 | A1 * | 12/2001 | Moslehi | ................ H01J 37/321 118/723 I |

FOREIGN PATENT DOCUMENTS

| JP | H11121381 A | 4/1999 |
| KR | 20110008537 A | 1/2011 |

(Continued)

*Primary Examiner* — Rudy Zervigon
(74) *Attorney, Agent, or Firm* — Renaissance IP Law Group LLP

(57) ABSTRACT

The present disclosure relates to a gas distribution apparatus for substrate processing apparatuses, including: a distribution body distributing a process gas toward a substrate supporting unit supporting a substrate; a first injection hole provided in the distribution body, a process gas which is to be distributed toward the substrate supporting unit being injected through the first inject hole; and a second injection hole provided in the distribution body at a position spaced apart from the first injection hole, a process gas which is to be distributed toward the substrate supporting unit being injected through the second inject hole, and a substrate processing apparatus.

17 Claims, 4 Drawing Sheets

(51) Int. Cl.
*C23C 16/455* (2006.01)
*C23C 16/50* (2006.01)
*H01L 21/687* (2006.01)

(52) U.S. Cl.
CPC .. *H01J 37/32541* (2013.01); *H01J 37/32715* (2013.01); *H01L 21/68764* (2013.01); *H01L 21/68771* (2013.01); *H05H 1/46* (2013.01); H01J 2237/20214 (2013.01); H01J 2237/327 (2013.01); H01J 2237/3321 (2013.01); H01J 2237/3323 (2013.01)

(58) Field of Classification Search
CPC ......... H01J 2237/327; H01J 2237/3321; H01J 2237/3323; H05H 1/46; C23C 16/45559; C23C 16/50; C23C 16/4584; C23C 16/509; H01L 21/68764; H01L 21/68771
USPC ....... 118/723 E; 156/345.43, 345.44, 345.45, 156/345.46, 345.47
See application file for complete search history.

(56) References Cited

FOREIGN PATENT DOCUMENTS

| | | | |
|---|---|---|---|
| KR | 20120053003 A | 5/2012 | |
| KR | 20130143236 A | 12/2013 | |

\* cited by examiner

GAS SPRAYING APPARATUS FOR SUBSTRATE PROCESSING APPARATUS AND SUBSTRATE PROCESSING APPARATUS

TECHNICAL FIELD

The present disclosure relates to a gas distribution apparatus for substrate processing apparatuses and a substrate processing apparatus, which perform a substrate processing process such as a deposition process of depositing a thin film on a substrate.

BACKGROUND ART

Generally, a thin-film layer, a thin-film circuit pattern, or an optical pattern should be formed on a substrate for manufacturing a solar cell, a semiconductor device, a flat panel display device, etc. To this end, a semiconductor manufacturing process is performed, and examples of the semiconductor manufacturing process include a thin film deposition process of depositing a thin film including a specific material on a substrate, a photo process of selectively exposing a portion of a thin film by using a photosensitive material, an etching process of removing a thin film corresponding to the selectively exposed portion to form a pattern, etc.

The semiconductor manufacturing process is performed inside a substrate processing apparatus which is designed based on an optimal environment for a corresponding process, and recently, substrate processing apparatuses for performing a deposition process or an etching process by using plasma are much used.

Examples of the substrate processing apparatuses based on plasma include plasma enhanced chemical vapor deposition (PECVD) apparatuses for forming a thin film by using plasma, plasma etching apparatuses for etching and patterning a thin film, etc.

FIG. 1 is a conceptual side view of a related art gas distribution apparatus.

Referring to FIG. 1, a related art gas distribution apparatus 100 is disposed so as to be located over a substrate 10 and distributes a process gas toward a substrate supporting unit 3. The related art gas distribution apparatus 100 is connected to a process gas supply unit 110 that supplies the process gas. The process gas supply unit 110 is connected to only one side 100a of the related art gas distribution apparatus 100. Therefore, the process gas supply unit 110 supplies the process gas through only the one side 100a of the related art gas distribution apparatus 100.

Therefore, in the related art gas distribution apparatus 100, a distribution amount of the process gas is relatively reduced in the other side 100b opposite to the one side 100a. For this reason, the related art gas distribution apparatus 100 has a problem where a partial deviation of a distribution amount of the process gas distributed toward the substrate 10 occurs.

Technical Problem

The present disclosure is devised to solve the above-described problems and is for providing a gas distribution apparatus for substrate processing apparatuses and a substrate processing apparatus, which can decrease a partial deviation of a distribution amount of a process gas distributed toward a substrate.

Technical Solution

To accomplish the above-described objects, the present disclosure may include below-described elements.

A substrate processing apparatus according to the present disclosure may include: a process chamber; a substrate supporting unit installed in the process chamber to support a plurality of substrates; a chamber lid covering an upper portion of the process chamber; and a process gas distribution unit installed in the chamber lid to distribute a process gas toward the substrate supporting unit. The process gas distribution unit may include a distribution body installed in the chamber lid and a plasma electrode facing the substrate supporting unit. The plasma electrode may include a first plasma electrode and a second plasma electrode, and the second plasma electrode may be shorter than the first plasma electrode.

A substrate processing apparatus according to the present disclosure may include: a process chamber; a substrate supporting unit installed in the process chamber to support a plurality of substrates; a chamber lid covering an upper portion of the process chamber; and a process gas distribution unit installed in the chamber lid to distribute a process gas toward the substrate supporting unit, wherein the process gas distribution unit may include a distribution body installed in the chamber lid, a first injection hole through which a process gas which is to be distributed toward the substrate supporting unit is injected, and a second injection hole through which a process gas which is to be distributed toward the substrate supporting unit is injected, and the first injection hole and the second injection hole may be provided at different positions in the distribution body.

In the substrate processing apparatus according to the present disclosure, the process gas distribution unit may include a plurality of first distribution holes provided in the distribution body, a plurality of second distribution holes provided at positions, spaced apart from the first distribution holes, in the distribution body, a first branch groove connecting the first distribution holes and the first injection hole so that the process gas injected through the first injection hole is distributed toward the substrate supporting unit through the first distribution holes, and a second branch groove connecting the second distribution holes and the second injection hole so that the process gas injected through the second injection hole is distributed toward the substrate supporting unit through the second distribution holes.

In the substrate processing apparatus according to the present disclosure, the first distribution holes may be provided in the distribution body along a first axis direction and are spaced apart from one another, and the second distribution holes may be provided in the distribution body along the first axis direction and are spaced apart from one another.

In the substrate processing apparatus according to the present disclosure, the first distribution holes may be disposed between the second distribution holes with respect to the first axis direction, and the second distribution holes may be disposed next to both sides of the first distribution holes with respect to the first axis direction so that a same number of second distribution holes and first distribution holes are located.

In the substrate processing apparatus according to the present disclosure, the first distribution holes may be provided to have a longer length than the second distribution holes with respect to a second axis direction vertical to the first axis direction, and the first branch groove is connected to a smaller number of first distribution holes than number of second distribution holes connected to the second branch groove.

In the substrate processing apparatus according to the present disclosure, the substrate supporting unit may rotate about a rotational shaft thereof, the first injection hole may be provided in an inner surface of the distribution body facing the rotational shaft of the substrate supporting unit, and the second injection hole may be provided in an outer surface located opposite to the inner surface of the distribution body.

In the substrate processing apparatus according to the present disclosure, the substrate supporting unit may rotate about a rotational shaft, the process gas distribution unit may include a plurality of first distribution holes, disposed along the first axis direction and spaced apart from one another, and a plurality of second distribution holes disposed along the first axis direction and spaced apart from one another, the distribution body may include a first body, where the first distribution holes are provided, and a second body provided to protrude from the first body with respect to the first axis direction, the second body may include a first sub-body provided to have a length, which is reduced in a direction toward the rotational shaft of the substrate supporting unit, in the first axis direction, and the second distribution holes may be provided in the second body, and some second distribution holes, spaced apart from the first distribution holes by a long distance with respect to the first axis direction, of the second distribution holes are provided to have a shorter length in the second axis direction vertical to the first axis direction.

In the substrate processing apparatus according to the present disclosure, the substrate supporting unit may rotate about a rotational shaft, the distribution body may include an inner surface, facing the rotational shaft of the substrate supporting unit, and an outer surface located opposite to the inner surface, and the outer surface may be provided to configure a curved surface having a curvature center located near the rotational shaft of the substrate supporting unit.

In the substrate processing apparatus according to the present disclosure, the process gas distribution unit may include a plurality of first distribution holes, disposed along a first axis direction and spaced apart from one another, and a plurality of second distribution holes disposed along the first axis direction and spaced apart from one another, and the first distribution holes and the second distribution holes may be provided in the distribution body and are spaced apart from the outer surface by the same distance.

In the substrate processing apparatus according to the present disclosure, the process gas distribution unit may be provided in plurality in the chamber lid, and at least one process gas distribution unit of the process gas distribution units may include a plasma electrode for generating plasma.

A gas distribution apparatus for substrate processing apparatuses according to the present disclosure may include a distribution body distributing a process gas toward a substrate supporting unit supporting a substrate, a first injection hole provided in the distribution body, a process gas which is to be distributed toward the substrate supporting unit being injected through the first inject hole, and a second injection hole provided in the distribution body at a position spaced apart from the first injection hole, a process gas which is to be distributed toward the substrate supporting unit being injected through the second inject hole.

The gas distribution apparatus for substrate processing apparatuses according to the present disclosure may include a plurality of first distribution holes provided in the distribution body and spaced apart from one another along a first axis direction, a plurality of second distribution holes provided at positions, spaced apart from the first distribution holes, in the distribution body and spaced apart from one another along the first axis direction, a first branch groove connecting the first distribution holes and the first injection hole so that the process gas injected through the first injection hole is distributed toward the substrate supporting unit through the first distribution holes, and a second branch groove connecting the second distribution holes and the second injection hole so that the process gas injected through the second injection hole is distributed toward the substrate supporting unit through the second distribution holes.

In the gas distribution apparatus for substrate processing apparatuses according to the present disclosure, the first distribution holes may be disposed between the second distribution holes with respect to the first axis direction, and the second distribution holes may be disposed next to both sides of the first distribution holes with respect to the first axis direction so that a same number of second distribution holes and first distribution holes are located.

In the gas distribution apparatus for substrate processing apparatuses according to the present disclosure, the first distribution holes may be provided to have a longer length than the second distribution holes with respect to a second axis direction vertical to the first axis direction, and the first branch groove may be connected to a smaller number of first distribution holes than number of second distribution holes connected to the second branch groove.

In the gas distribution apparatus for substrate processing apparatuses according to the present disclosure, the first injection hole may be provided in an inner surface of the distribution body facing the rotational shaft of the substrate supporting unit, and the second injection hole may be provided in an outer surface located opposite to the inner surface of the distribution body.

The gas distribution apparatus for substrate processing apparatuses according to the present disclosure may include a plurality of first distribution holes, disposed along the first axis direction and spaced apart from one another, and a plurality of second distribution holes disposed along the first axis direction and spaced apart from one another, wherein the distribution body may include a first body, where the first distribution holes are provided, and a second body provided to protrude from the first body with respect to the first axis direction, the second body may include a first sub-body provided to have a length, which is reduced in a direction toward a rotational shaft of the substrate supporting unit, in the first axis direction, the second distribution holes may be provided in the second body, and some second distribution holes, spaced apart from the first distribution holes by a long distance with respect to the first axis direction, of the second distribution holes may be provided to have a shorter length in the second axis direction vertical to the first axis direction.

The gas distribution apparatus for substrate processing apparatuses according to the present disclosure may include a plurality of first distribution holes, disposed along a first axis direction and spaced apart from one another, and a plurality of second distribution holes disposed along the first axis direction and spaced apart from one another, wherein the distribution body may include an inner surface, facing a rotational shaft of the substrate supporting unit, and an outer surface located opposite to the inner surface, the outer surface may be provided to configure a curved surface having a curvature center located near the rotational shaft of the substrate supporting unit, and the first distribution holes and the second distribution holes may be provided in the distribution body and may be spaced apart from the outer surface by the same distance.

The gas distribution apparatus for substrate processing apparatuses according to the present disclosure may include a plasma electrode for generating plasma, wherein the plasma electrode may be installed in the distribution body.

Advantageous Effect

According to the present disclosure, the following effects can be obtained.

The present disclosure decreases a partial deviation of a distribution amount of a process gas distributed to a substrate supporting unit to enable a gas to be uniformly distributed on a substrate, thereby enhancing the quality of a substrate for which a processing process has been performed.

The present disclosure decreases a partial deviation of a distribution amount of a process gas distributed to a substrate supporting unit to reduce a partial deviation of a speed at which a processing process is performed on a substrate, thereby increasing a productivity of the substrate for which the processing process is completed and decreasing a consumption amount of the process gas to reduce the process cost of the processing process.

MODE FOR INVENTION

Hereinafter, embodiments of a substrate processing apparatus according to the present disclosure will be described in detail with reference to the accompanying drawings. A gas distribution apparatus for substrate processing apparatuses according to the present disclosure may be included in a substrate processing apparatus according to the present disclosure, and thus, will be described together while describing embodiments of the substrate processing apparatus according to the present disclosure.

Figure 1:
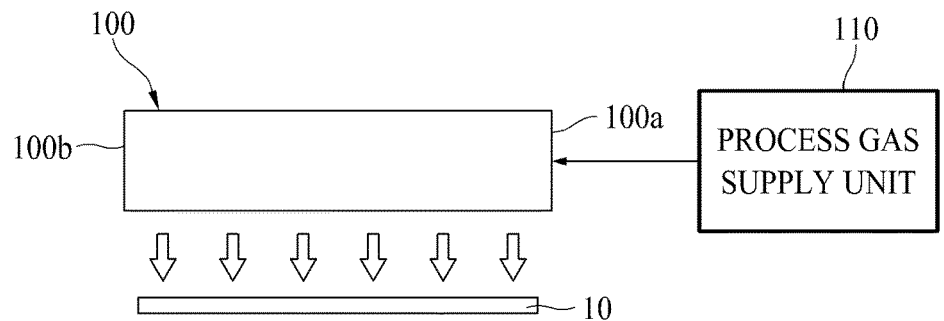
FIG. 1 is a conceptual side view of a related art gas distribution apparatus.
Figure 2:
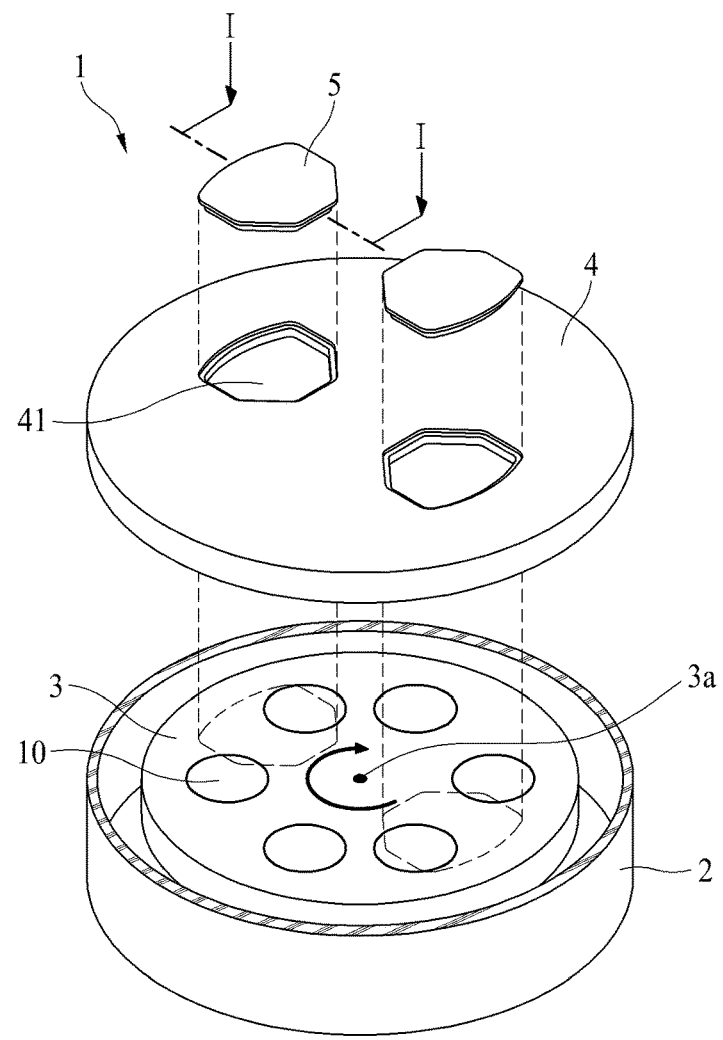
FIG. 2 is a schematically exploded perspective view of a substrate processing apparatus according to the present disclosure.

Referring to FIG. 2, a substrate processing apparatus 1 according to the present disclosure performs a processing process on a substrate 10. For example, the substrate processing apparatus 1 according to the present disclosure may perform a deposition process of depositing a thin film on the substrate 10. The substrate processing apparatus 1 according to the present disclosure includes a process chamber 2 where the deposition process is performed, a substrate supporting unit 3 installed in the process chamber 2, a chamber lid 4 that covers an upper portion of the process chamber 2, and a process gas distribution unit 5 that distributes a process gas.

Referring to FIG. 2, the process chamber 2 provides a process space where the processing process is performed. The substrate supporting unit 3 and the chamber lid 4 may be installed in the process chamber 2. An exhaust unit for exhausting a gas and/or the like remaining in the process space may be installed in the process chamber 2.

Referring to FIG. 2, the substrate supporting unit 3 supports a plurality of substrates 10. The substrates 10 are loaded into the process chamber 2 by a loading apparatus (not shown) installed outside the process chamber 2. The substrates 10 may be semiconductor substrates or wafers. The substrate 10 for which the processing process is completed may be unloaded from the process chamber 2 by an unloading apparatus (not shown) installed outside the process chamber 2. The unloading apparatus and the loading apparatus may be implemented as one piece of equipment.

The substrate supporting unit 3 may be installed in the process chamber 2 so as to be located inside the process chamber 2. The substrate supporting unit 3 may be rotatably installed in the process chamber 2. The substrate supporting unit 3 may be installed in the process chamber 2 so as to clockwise and counterclockwise rotate about a rotational shaft 3a. In this case, the substrates 10 may be supported by the substrate supporting unit 3 so as to be spaced apart from each other and arranged at the same angle along a rotational direction (an R1 arrow direction) of the substrate supporting unit 3. In FIG. 2, it is illustrated that the rotational direction (the R1 arrow direction) is a clockwise direction about the rotational shaft 3a, but the rotational direction (the R1 arrow direction) may be a counterclockwise direction about the rotational shaft 3a without being limited thereto. The substrate supporting unit 3 may rotate in the rotational direction (the R1 arrow direction) by a driver (not shown). The driver may include a motor that generates a rotational force for rotating the substrate supporting unit 3. The driver may further include a power transfer unit (not shown) that connects the motor and the substrate supporting unit 3. The power transfer unit may be a pulley, a belt, a chain, a gear, or the like. The driver may be installed in the process chamber 2 so as to be located outside the process chamber 2.

Referring to FIG. 2, the chamber lid 4 is installed in the process chamber 2 to cover the upper portion of the process chamber 2. Therefore, the chamber lid 4 may seal the process space. The chamber lid 4 and the process chamber 2, as illustrated in FIG. 2, may be provided in a cylindrical structure, but may be provided in an elliptical structure, a polygonal structure, or the like without being limited thereto.

Figure 3:
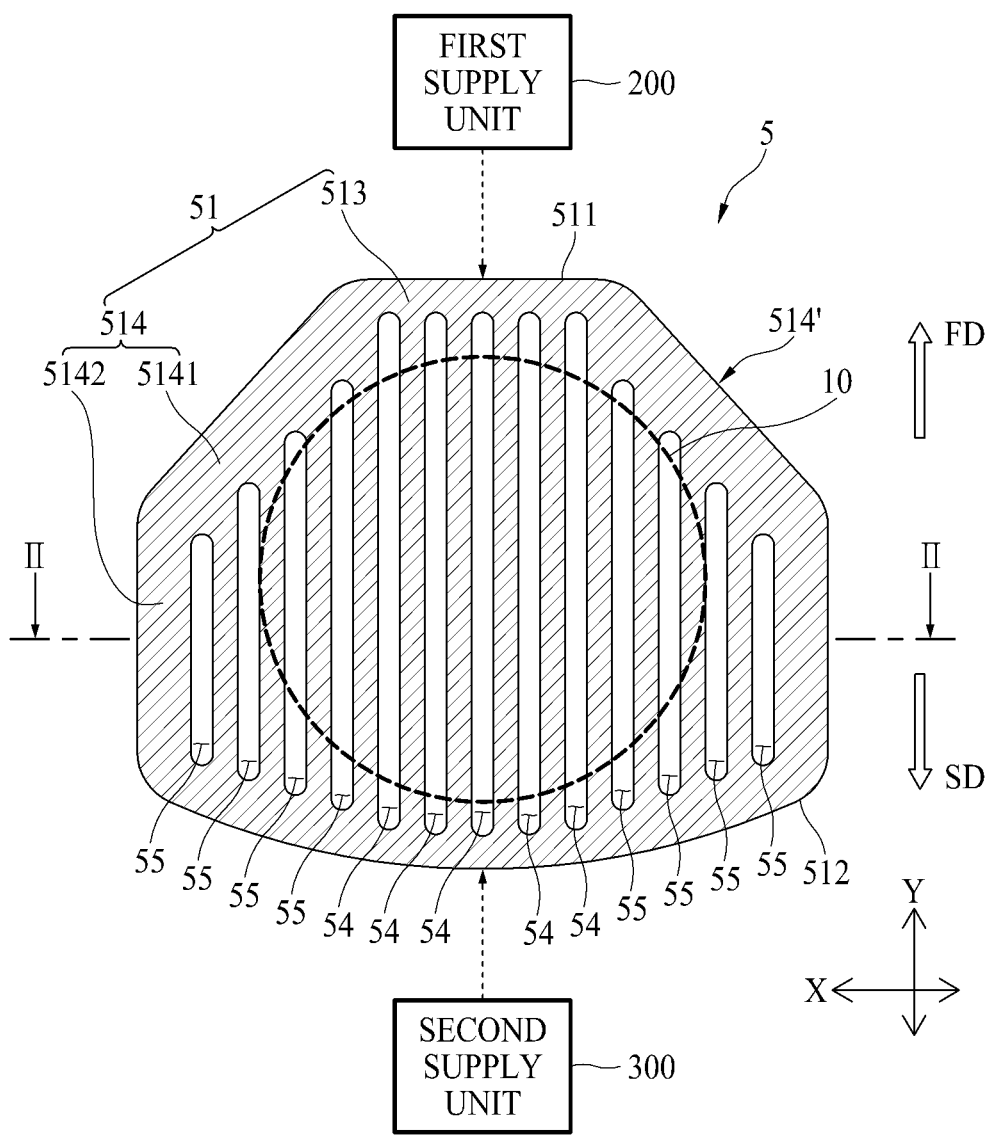
FIG. 3 is a schematic plan cross-sectional view illustrating a process gas distribution unit in a substrate processing apparatus according to the present disclosure with respect to line I-I of FIG. 2.
Figure 4:
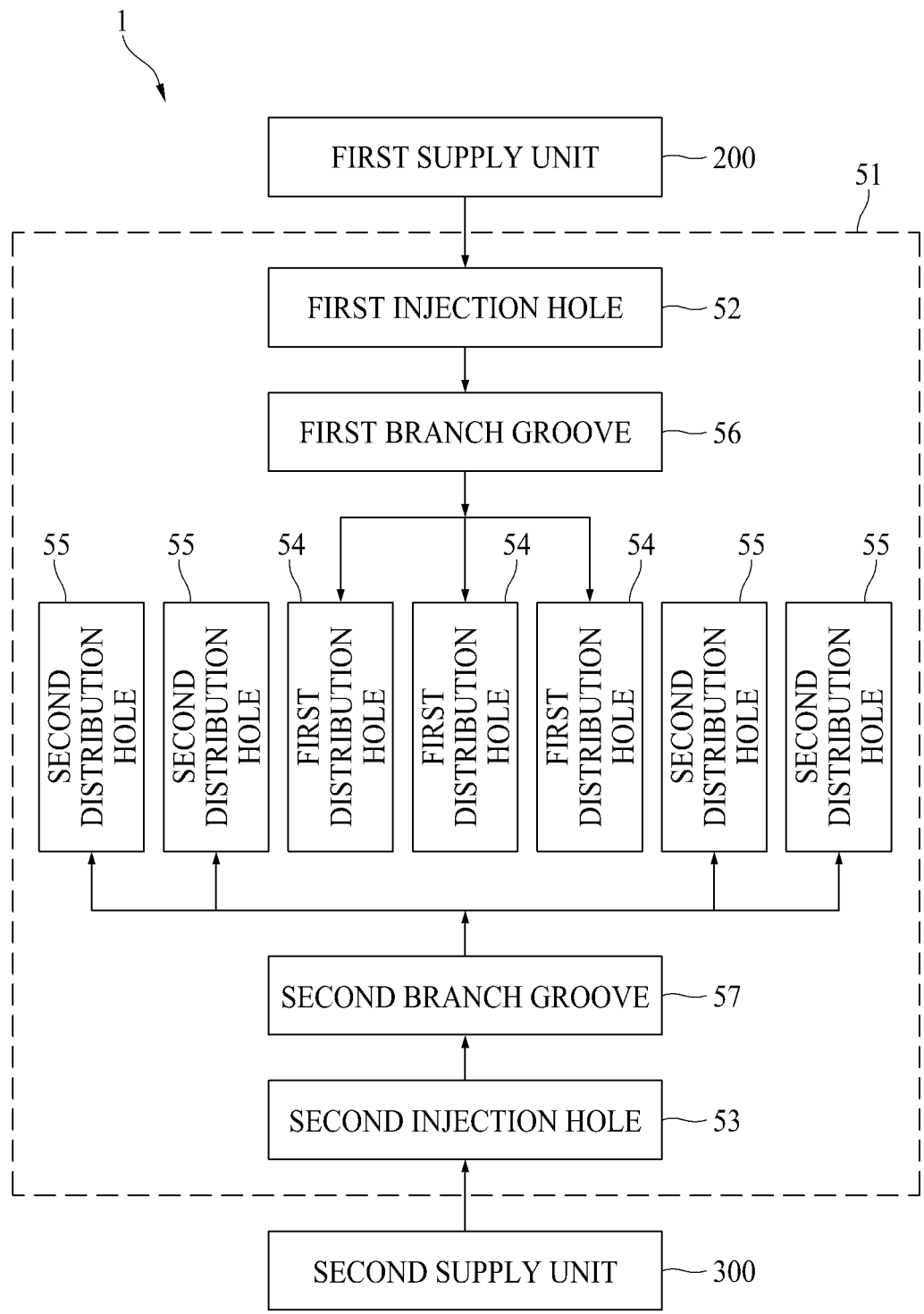
FIG. 4 is a schematic block diagram of a process gas distribution unit in a substrate processing apparatus according to the present disclosure.

Referring to FIGS. 2 to 4, the process gas distribution unit 5 distributes a process gas toward the substrate supporting unit 3. The process gas distribution unit 5 may be implemented with a gas distribution apparatus for substrate process apparatuses according to the present disclosure. The process gas distribution unit 5 may be installed in the chamber lid 4 to distribute the process gas toward the substrate supporting unit 3.

The process gas distribution unit 5 may include a distribution body 51, a first injection hole 52, and a second injection hole 53.

The distribution body 51 is installed in the chamber lid 4. The distribution body 51 may be installed in the chamber lid 4 to distribute the process gas toward the substrate supporting unit 3. The distribution body 51 may be installed in the chamber lid 4 so as to be located over the substrate supporting unit 3. An installation hole 41 for installing the distribution body 51 may be provided in the chamber lid 4. The distribution body 51 may be inserted into the installation hole 41, and thus, may be installed in the chamber lid 4. The installation hole 41 may be provided to pass through the chamber lid 4.

The first injection hole 52 is for injecting a process gas. The process gas may be injected into the distribution body 51 through the first injection hole 52, and then, may be distributed toward the substrate supporting unit 3. The first injection hole 52 may be provided in the distribution body 51. The first injection hole 52 may be provided to pass through the distribution body 51 in order for the inside of the distribution body 51 to communicate with the outside of the distribution body 51. One side of the first injection hole 52 may be connected to the distribution body 51 so as to communicate with the inside of the distribution body 51. The other side of the first injection hole 52 may be connected to a first supply unit 200. The first supply unit 200 is for supplying a process gas. The process gas supplied from the first supply unit 200 may be injected into the distribution body 51 through the first injection hole 52. The first supply unit 200 may be connected to the first injection hole 52 through a pipe.

The second injection hole 53 is for injecting a process gas. The process gas may be injected into the distribution body 51 through the second injection hole 53, and then, may be distributed toward the substrate supporting unit 3. The second injection hole 53 may be provided in the distribution body 51. The second injection hole 53 may be provided to pass through the distribution body 51 in order for the inside of the distribution body 51 to communicate with the outside of the distribution body 51. One side of the second injection hole 53 may be connected to the distribution body 51 so as to communicate with the inside of the distribution body 51. The other side of the second injection hole 53 may be connected to a second supply unit 300. The second supply unit 300 is for supplying a process gas. The process gas supplied from the second supply unit 300 may be injected into the distribution body 51 through the second injection hole 53. The second supply unit 300 may be connected to the second injection hole 53 through a pipe. The second supply unit 300 and the first supply unit 200 may supply the same process gas. The second supply unit 300 and the first supply unit 200 may be provided and implemented as one supply unit.

The second injection hole 53 and the first injection hole 52 may be provided at different positions in the distribution body 51. The process gas distribution unit 5 is implemented in order for a process gas to be injected into the distribution body 51 through a plurality of positions. Therefore, the substrate processing apparatus 1 according to the present disclosure can provide the following effect.

First, the substrate processing apparatus 1 according to the present disclosure can decrease a partial deviation of a distribution amount of a process gas distributed toward the substrate supporting unit 3 by using the second injection hole 53 and the first injection hole 52. Therefore, the substrate processing apparatus 1 according to the present disclosure is implemented in order for a gas to be uniformly distributed on the substrate 10, thereby enhancing the quality of the substrate 10 for which the processing process has been performed. For example, in a case where the processing process is a deposition process, the substrate processing apparatus 1 according to the present disclosure can enhance a film characteristic of a thin film deposited on the substrate 10, and moreover, can enhance a uniformity of the thin film deposited on the substrate 10.

Second, in a case where the processing process is a deposition process, if a partial deviation of a distribution amount of a process gas distributed toward the substrate supporting unit 3 occurs, a partial deviation of a deposition speed at which a thin film is deposited on the substrate 10 occurs. Therefore, in order to wholly deposit a thin film having a predetermined thickness on the substrate 10, a total process time should increase in consideration of a portion where a deposition speed is slow. On the other hand, the substrate processing apparatus 1 according to the present disclosure decreases a partial deviation of a distribution amount of a process gas distributed toward the substrate 10, thereby reducing a partial deviation of the deposition speed. Therefore, the substrate processing apparatus 1 according to the present disclosure can shorten a total process time, and thus, a productivity of the substrate 10 for which the deposition process is completed can increase. Also, the substrate processing apparatus 1 according to the present disclosure can reduce a consumption amount of a process gas in performing the deposition process, thereby reducing the process cost of the deposition process.

The second injection hole 53 and the first injection hole 52 may be provided so as to be located at opposite positions with respect to the distribution body 51. In this case, the first injection hole 52 may be provided in an inner surface 511 (shown in FIG. 3) of the distribution body 51. The second injection hole 53 may be provided in an outer surface 512 (shown in FIG. 3) of the distribution body 51. The inner surface 511 is a surface which faces the rotational shaft 3a of the substrate supporting unit 3 in the distribution body 51. The outer surface 512 is a surface which is located at a position opposite to the inner surface 511. Therefore, the process gas distribution unit 5 may be implemented to inject a process gas into opposite positions with respect to the distribution body 51. Accordingly, the substrate processing apparatus 1 according to the present disclosure can more decrease a partial deviation of a distribution amount of a process gas distributed toward the substrate supporting unit 3.

Referring to FIGS. 2 to 4, the process gas distribution unit 5 may include a first distribution hole 54 and a second distribution hole 55.

Figure 5:
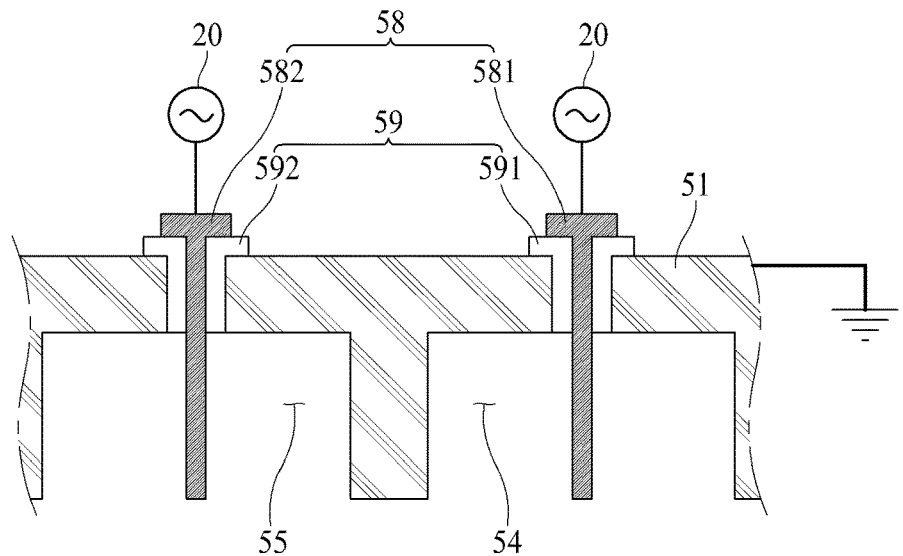
FIG. 5 is a schematic partial side cross-sectional view illustrating a process gas distribution unit in a substrate processing apparatus according to the present disclosure with respect to line II-II of FIG. 4.

The first distribution hole 54 is for distributing a process gas. The first distribution hole 54 may be provided in the distribution body 51. The first distribution hole 54 may be provided in the distribution body 51 to pass through a lower surface facing the substrate supporting unit 3. The first distribution hole 54 may be connected to the first injection hole 52. In this case, the process gas injected through the first injection hole 52 may be distributed toward the substrate supporting unit 3 through the first distribution hole 54. The process gas distribution unit 5 may include the first distribution hole 54 which is provided in plurality. In this case, the first distribution holes 54 may be arranged in the distribution body 51 and may be spaced apart from one another along a first axis direction (an X axis direction). Each of the first distribution holes 54 may be provided to have a longer length in a second axis direction (a Y axis direction) than the first axis direction (the X axis direction). The second axis direction (the Y axis direction) is an axis direction vertical to the first axis direction (the X axis direction). For example, each of the first distribution holes 54 may be provided as a slit type. In FIG. 5, the process gas distribution unit 5 is illustrated as including five first distribution holes 54, but the process gas distribution unit 5 may include two, three, four, or six or more first distribution holes 54 without being limited thereto. The first distribution holes 54 may be spaced apart from one another and may be arranged at the same interval along the first axis direction (the X axis direction).

The second distribution hole 55 is for distributing a process gas. The second distribution hole 55 may be provided in the distribution body 51. The second distribution hole 55 may be provided in the distribution body 51 to pass through the lower surface facing the substrate supporting unit 3. The second distribution hole 55 may be provided in the distribution body 51 at a position spaced apart from the first distribution hole 54. The second distribution hole 55 may be connected to the second injection hole 53. In this case, the process gas injected through the second injection hole 53 may be distributed toward the substrate supporting unit 3 through the second distribution hole 55. The process gas distribution unit 5 may include the second distribution hole 55 which is provided in plurality. In this case, the second distribution holes 55 may be arranged in the distribution body 51 and may be spaced apart from one another along the first axis direction (the X axis direction). Each of the second distribution holes 55 may be provided to have a longer length in the second axis direction (the Y axis direction) than the first axis direction (the X axis direction). For example, each of the second distribution holes 55 may be provided as a slit type. In FIG. 5, the process gas distribution unit 5 is illustrated as including eight second distribution holes 55, but the process gas distribution unit 5 may include two, three, four, or six or more second distribution holes 55 without being limited thereto. The second distribution holes 55 may be spaced apart from one another and may be arranged at the same interval along the first axis direction (the X axis direction).

The second distribution holes 55 may be provided in the distribution body 51 at positions spaced apart from the first distribution holes 54. The second distribution holes 55 may be disposed so as to be located next to both sides of the first distribution holes 54 with respect to the first axis direction (the X axis direction). In this case, the first distribution holes 54 may be disposed so as to be located between the second distribution holes 55 with respect to the first axis direction (the X axis direction). The second distribution holes 55 equal to the number of the first distribution holes 54 may be disposed next to both sides of the first distribution holes 54 with respect to the first axis direction (the X axis direction). Therefore, the process gas distribution unit 5 can decrease a deviation of a distribution amount of the process gas distributed through the both sides of the first distribution holes 54 with respect to the first axis direction (the X axis direction). Accordingly, the substrate processing apparatus 1 according to the present disclosure is implemented so that a gas is uniformly distributed on the substrate 10 with respect to the first axis direction (the X axis direction), thereby enhancing the quality of the substrate 10 for which the processing process has been performed.

Here, the distribution body 51 may include a first body 513 (shown in FIG. 4) and a second body 514 (shown in FIG. 4).

The first distribution holes 54 may be provided in the first body 513. The first distribution holes 54 may be disposed in the first body 513 and may be spaced apart from one another along the first axis direction (the X axis direction). The first injection holes 52 and the second injection holes 53 may be provided in the first body 513. The first injection holes 52 and the second injection holes 53 may be provided so as to be located at opposite positions with respect to the first body 513. In this case, the first injection hole 52 may be provided in an inner surface of the first body 513. The second injection hole 53 may be provided in an outer surface of the first body 513. The first body 53 may be provided in wholly rectangular parallelepiped shape.

The second distribution holes 55 may be provided in the second body 514. The second distribution holes 55 may be disposed in the second body 514 and may be spaced apart from one another along the first axis direction (the X axis direction).

The second body 514 may include a first sub-body 5141 (shown in FIG. 4). The first sub-body 5141 may be provided so that a length of the first sub-body 5141 in the first axis direction (the X axis direction) is reduced in a direction (hereinafter referred to as 'a first direction (an FD arrow direction)') toward the rotational shaft 3a of the substrate supporting unit 3. Therefore, a front end portion of the distribution body 51 disposed in the first direction (the FD arrow direction) may be provided to have a size which is reduced in the first direction (the FD arrow direction). In this case, some second distribution holes 55, spaced apart from the first distribution holes 54 by a long distance with respect to the first axis direction (the X axis direction), of the second distribution holes 55 may be provided to have a shorter length in the second axis direction (the Y axis direction). Therefore, the process gas distribution unit 5 may progressively decrease areas of the second distribution holes 55 in the front end portion of the distribution body 51. Therefore, the substrate processing apparatus 1 according to the present disclosure may decrease a distribution amount of a process gas distributed to a region close to the rotational shaft 3a of the substrate supporting unit 3, thereby preventing a thin film from being thicker deposited on a portion of the substrate 10 close to the rotational shaft 3a of the substrate supporting unit 3. Therefore, the substrate processing apparatus 1 according to the present disclosure can enhance a uniformity of the thin film deposited on the substrate 10. Also, if the substrate 10 is provided in a circular shape, the substrate processing apparatus 1 according to the present disclosure may reduce a flow rate of a process gas distributed to a wider region than the substrate 10 in the region close to the rotational shaft 3a of the substrate supporting unit 3, thereby decreasing the amount of generated particles caused by deposition of the process gas on the substrate supporting unit 3. Accordingly, the substrate processing apparatus 1 according to the present disclosure decreases a degree to which the substrate 10 is polluted due to the particles occurring in the substrate supporting unit 3, thereby further enhancing the quality of the substrate 10 for which the processing process is completed.

The second body 514 may include a second sub-body 5142 (shown in FIG. 4). The second sub-body 5142 may be located in a second direction (an SD arrow direction) with respect to the first sub-body 5141. The second direction (the SD arrow direction) is a direction opposite to the first axis direction (the X axis direction). The second sub-body 5142 may be provided to extend from the first sub-body 5141 in the second direction (the SD arrow direction) without any change in length with respect to the first axis direction (the X axis direction). The second sub-body 5142 and the first sub-body 5141 may be provided as one body.

The second body 514 may be provided to protrude from the first body 513 with respect to the first axis direction (the X axis direction). The second sub-body 5142 and the first sub-body 5141 may be provided as one body. The process gas distribution unit 5 may include the second body 514 which is provided in plurality. In this case, the second bodies 514 and 514' may be provided to protrude in both sides of the first body 513 with respect to the first axis direction (the X axis direction). The second bodies 514 and 514' may be disposed as a symmetric type with respect to the first axis direction (the X axis direction). Therefore, the process gas distribution unit 5 can decrease a deviation of a distribution amount of a process gas distributed to the both sides of the first body 513 with respect to the first axis direction (the X axis direction). Accordingly, the substrate processing apparatus 1 according to the present disclosure is implemented so that a gas is uniformly distributed on the substrate 10 with respect to the first axis direction (the X axis direction), thereby enhancing the quality of the substrate 10 for which the processing process has been performed.

The outer surface 512 of the distribution body 51 may be provided to configure a curved surface. The outer surface 512 of the distribution body 51 may be provided to form the curved surface having a curvature center located in the first direction (the FD arrow direction). Therefore, a portion, where the outer surface 512 is provided, of the distribution body 51 may be provided to have a size which is reduced in the second direction (the SD arrow direction). In this case, each of the first distribution holes 54 and the second distribution holes 55 may be provided in the distribution body 51 and may be spaced apart from the outer surface 512 of the distribution body 51 by the same distance. Therefore, some second distribution holes 55, spaced apart from the first distribution holes 54 by a long distance with respect to the first axis direction (the X axis direction), of the second distribution holes 55 may be provided to have a shorter length in the second axis direction (the Y axis direction). Therefore, the process gas distribution unit 5 may be implemented so that areas of the second distribution holes 55 are progressively reduced in a portion where the outer surface 512 of the distribution body 51 is provided. Therefore, if the substrate 10 is provided in a circular shape, the substrate processing apparatus 1 according to the present disclosure may reduce a flow rate of a process gas distributed from the portion, where the outer surface 512 of the distribution body 51 is provided, to a wider region than the substrate 10, thereby decreasing the amount of generated particles caused by deposition of the process gas on the substrate supporting unit 3. Accordingly, the substrate processing apparatus 1 according to the present disclosure decreases a degree to which the substrate 10 is polluted due to the particles occurring in the substrate supporting unit 3, thereby further enhancing the quality of the substrate 10 for which the processing process is completed.

Referring to FIGS. 2 to 4, the process gas distribution unit 5 may include a first branch groove 56 (shown in FIG. 4) and a second branch groove 57 (shown in FIG. 4).

The first branch groove 56 connects the first distribution holes 54 and the first injection holes 52. Therefore, a process gas injected through the first injection hole 52 may be branched while flowing along the first branch groove 56 and may be distributed to each of the first distribution holes 54, and then, may be distributed toward the substrate supporting unit 3 through the first distribution holes 54. The first branch groove 56 may be provided in the distribution body 51. The first branch groove 56 may be implemented as a flow path, connecting the first distribution holes 54 and the first injection holes 52, by processing a groove inside the distribution body 51. The first branch grooves 56 may each be implemented as a flow path, connecting the first distribution holes 54 and the first injection holes 52, through injection molding in a process of manufacturing the distribution body 51. The first branch groove 56 may be disposed between the first injection hole 52 and the first distribution holes 54 with respect to the second axis direction (the Y axis direction).

The second branch groove 57 connects the second distribution holes 55 and the second injection holes 53. Therefore, a process gas injected through the second injection hole 53 may be branched while flowing along the second branch groove 57 and may be distributed to each of the second distribution holes 55, and then, may be distributed toward the substrate supporting unit 3 through the second distribution holes 55. The second branch groove 57 may be provided in the distribution body 51. The second branch groove 57 may be implemented as a flow path, connecting the second distribution holes 55 and the second injection holes 53, by processing a groove inside the distribution body 51. The second branch grooves 57 may each be implemented as a flow path, connecting the second distribution holes 55 and the second injection holes 53, through injection molding in a process of manufacturing the distribution body 51.

The second branch groove 57 may be disposed between the second injection hole 53 and the second distribution holes 55 with respect to the second axis direction (the Y axis direction).

Here, the first distribution holes 54 may be provided to have a longer length than the second distribution holes 55 with respect to the second axis direction (the Y axis direction). In this case, the first branch groove 56 may be connected to a smaller number of first distribution holes 54 than the number of the second distribution holes 55 connected to the second branch groove 57. Therefore, even when the first distribution holes 54 are provided to have a longer length than the second distribution holes 55 with respect to the second axis direction (the Y axis direction), the process gas distribution unit 5 can decrease a partial deviation of a distribution amount of a process gas in each of the first distribution holes 54. Accordingly, the substrate processing apparatus 1 according to the present disclosure is implemented so that a gas is uniformly distributed on the substrate 10 with respect to the first axis direction (the X axis direction), thereby enhancing the quality of the substrate 10 for which the processing process has been performed.

Referring to FIGS. 2 to 5, the substrate processing apparatus 1 according to the present disclosure may include the process gas distribution unit 5 which is provided in plurality. At least some of the process gas distribution units 5 may be implemented to activate and distribute a process gas by using plasma. At least some of the process gas distribution units 5 may be implemented to distribute the process gas without using the plasma. The process gas distribution unit 5 that activates and distributes the process gas by using the plasma will be described below in detail.

The process gas distribution unit 5 may include a plasma electrode 58 (shown in FIG. 5).

The plasma electrode 58 is used to generate the plasma. The substrate 10 supported by the substrate supporting unit 3 passes by a lower side of the plasma electrode 58 while rotating about the rotational shaft 3a. The plasma electrode 58 may generate the plasma by using a plasma power applied from a plasma power supply source 20 (shown in FIG. 5). In this case, the plasma may be generated from an electric field generated between the plasma electrode 58 and the distribution body 51, based on the plasma power. Therefore, a process gas may be activated by the plasma and distributed. The plasma power supply source 10 may apply the plasma power based on a high frequency power or a radio frequency (RF) power to the plasma electrode 58. In a case where the plasma power supply source 10 applies the plasma power based on the RF power, the plasma power supply source 10 may apply the plasma power based on a low frequency (LF) power, a middle frequency (MF) power, a high frequency (HF) power, or a very high frequency (VHF) power. The LF power may have a frequency within a range of 3 kHz to 300 kHz. The MF power may have a frequency within a range of 300 kHz to 3 MHz. The HF power may have a frequency within a range of 3 MHz to 30 MHz. The VHF power may have a frequency within a range of 30 MHz to 300 MHz.

The plasma electrode 58 may be disposed to face the substrate supporting unit 3. The plasma electrode 58 may be installed in the distribution body 51. The distribution body 51 may be electrically connected to the chamber lid 4, and thus, may be electrically grounded through the chamber lid 4. An insulation member 59 (shown in FIG. 5) may be located between the plasma electrode 58 and the distribution body 51. The insulation member 59 may electrically insulate the plasma electrode 58 from the distribution body 51. The insulation member 59 may be inserted into the distribution body 51, and thus, may be installed in the distribution body 51. The plasma electrode 58 may be inserted into a through hole which is provided in the insulation member 59, and thus, may be installed in the distribution body 51 through the insulation member 59.

The process gas distribution unit 5 may include the plasma electrode 58 which is provided in plurality. In this case, the plasma electrodes 58 may be installed in the distribution body 51 so as to be respectively inserted into the distribution holes 54 and 55. Therefore, the substrate processing apparatus 1 according to the present disclosure may be implemented so that the plasma electrode and a ground electrode are alternately and repeatedly disposed along the first axis direction (the X axis direction). Accordingly, the substrate processing apparatus 1 according to the present disclosure can increase a processing efficiency of the processing process. The plasma electrodes 58 may be respectively inserted into the distribution holes 54 and 55 so as to be disposed in parallel with an inner wall where each of the distribution holes 54 and 55 is provided in the distribution body 51.

The plasma electrode 58 may include a first plasma electrode 581 (shown in FIG. 5) and a second plasma electrode 582 (shown in FIG. 5).

The first plasma electrode 581 is for generating plasma. The first plasma electrode 581 may be disposed to face the substrate supporting unit 3. The first plasma electrode 581 may be installed in the distribution body 51. The first plasma electrode 581 may generate the plasma from the plasma power applied from the plasma power supply source 20. In this case, the plasma may be generated from an electric field generated between the first plasma electrode 581 and the distribution body 51 according to the plasma power. Therefore, a process gas may be activated by the plasma and distributed. The first plasma electrode 581 may be inserted into a through hole provided in a first insulation member 591 (shown in FIG. 5), and thus, may be installed so as to be insulated from the distribution body 51 through the first insulation member 591. The first plasma electrode 581 may be installed in the distribution body 51 so as to be inserted into the first distribution hole 54.

The second plasma electrode 582 is for generating plasma. The second plasma electrode 582 may be disposed to face the substrate supporting unit 3. The second plasma electrode 582 may be installed in the distribution body 51. The second plasma electrode 582 may generate the plasma from the plasma power applied from the plasma power supply source 20. In this case, the plasma may be generated from an electric field generated between the second plasma electrode 582 and the distribution body 51 according to the plasma power. Therefore, a process gas may be activated by the plasma and distributed. The second plasma electrode 582 may be inserted into a through hole provided in a second insulation member 592 (shown in FIG. 5), and thus, may be installed so as to be insulated from the distribution body 51 through the second insulation member 592. The second plasma electrode 582 may be installed in the distribution body 51 so as to be inserted into the second distribution hole 55.

The second plasma electrode 582 may be implemented shorter than the first plasma electrode 581. The second plasma electrode 582 may be provided to have a shorter length than the first plasma electrode 581 with respect to the second axis direction (the Y axis direction). Accordingly, the substrate processing apparatus 1 according to the present disclosure can obtain the following effects.

First, in the substrate processing apparatus 1 according to the present disclosure, the second plasma electrode 582 is implemented shorter than the first plasma electrode 581, and thus, as illustrated as a dotted line in FIG. 3, when the substrate 10 is located in a center portion of the distribution body 51, a length by which the second plasma electrode 582 protrudes from the substrate 10 with respect to the second axis direction (the Y axis direction) can be reduced. Therefore, the substrate processing apparatus 1 according to the present disclosure can decrease the amount of generated particles caused by deposition of the process gas on the substrate supporting unit 3. When the second plasma electrode 582 is implemented to have the same length as that of the first plasma electrode 581, the second plasma electrode 582 protrudes by an excessive length from the substrate 10 with respect to the second axis direction (the Y axis direction), and thus, the process gas is deposited on the substrate supporting unit 3 located outside the substrate 10, causing particles. In order to prevent the particles, in the substrate processing apparatus 1 according to the present disclosure, since the second plasma electrode 582 is implemented shorter than the first plasma electrode 581, a length of the second plasma electrode 582 may be adjusted to correspond to a deposition surface of the substrate 10, thereby preventing the unnecessary generation of particles.

Second, in the substrate processing apparatus 1 according to the present disclosure, the first plasma electrode 581 is implemented shorter than the second plasma electrode 582, and as illustrated as a dotted line in FIG. 3, a whole deposition surface of the substrate 10 may be implemented to pass by a lower side of the first plasma electrode 581 in a process where the substrate 10 rotates so as to be located in a center portion of the distribution body 51. Accordingly, the substrate processing apparatus 1 according to the present disclosure is implemented so that a thin film is uniformly deposited on a whole portion of the substrate 10 including an edge portion of the substrate 10, thereby enhancing a uniformity of the thin film deposited on the substrate 10.

The substrate processing apparatus 1 according to the present disclosure may include the first plasma electrode 581 provided in plurality and the second plasma electrode 582 provided in plurality. In this case, the first plasma electrodes 581 may be installed in the distribution body 51 so as to be respectively inserted into the first distribution holes 54, and the second plasma electrodes 582 may be installed in the distribution body 51 so as to be respectively inserted into the second distribution holes 55.

Figure 6:
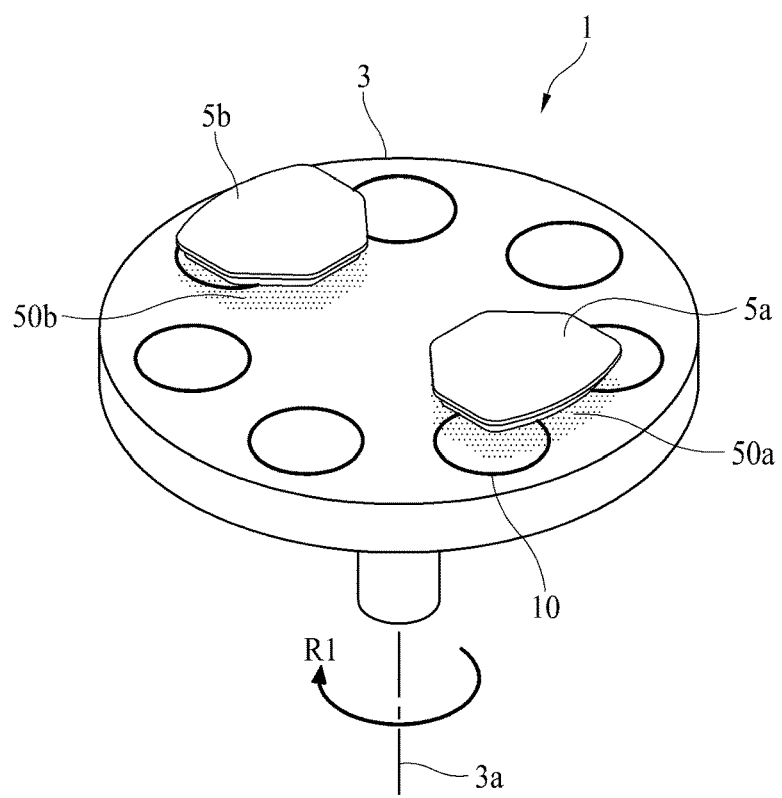
FIG. 6 is a conceptual perspective view of a substrate processing apparatus according to the present disclosure.

Referring to FIGS. 2 to 6, the substrate processing apparatus 1 according to the present disclosure may include a first process gas distribution unit 5a (shown in FIG. 6) and a second process gas distribution unit 5b (shown in FIG. 6).

The first process gas distribution unit 5a distributes a reactant gas. The reactant gas is included in the process gas used in the processing process. The first process gas distribution unit 5a may be installed in the chamber lid 4 to distribute the reactant gas toward the substrate supporting unit 3. In this case, the first process gas distribution unit 5a may be installed in the chamber lid 4 so as to be located over the substrate supporting unit 3. The first process gas distribution unit 5a may be inserted into the installation hole 41 and may be installed in the chamber lid 4. Except that the process gas is changed to the reactant gas in the process gas distribution unit 5, the first process gas distribution unit 5a approximately matches the process gas distribution unit 5, and thus, its detailed description is omitted. The first process gas distribution unit 5a may activate the reactant gas by using plasma to distribute the activated reactant gas toward the substrate supporting unit 3. In this case, the first process gas distribution unit 5a may include the plasma electrode 58.

The first process gas distribution unit 5a may distribute the reactant gas to a reactant gas distribution area 50a (shown in FIG. 6). In this case, the substrates 10 supported by the substrate supporting unit 3 may pass by the reactant gas distribution area 50a according to the substrate supporting unit 3 rotating in the rotational direction (the R1 arrow direction). Therefore, the first process gas distribution unit 5a may distribute the reactant gas to the substrate 10 located in the reactant gas distribution area 50a. The reactant gas distribution area 50a may be located between the first process gas distribution unit 5a and the substrate supporting unit 3.

The second process gas distribution unit 5b distributes a source gas. The source gas is included in the process gas used in the processing process. The second process gas distribution unit 5b may be installed in the chamber lid 4 to distribute the source gas toward the substrate supporting unit 3. In this case, the second process gas distribution unit 5b may be installed in the chamber lid 4 so as to be located over the substrate supporting unit 3. The second process gas distribution unit 5b may be inserted into the installation hole 41 and may be installed in the chamber lid 4. Except that the process gas is changed to the source gas in the process gas distribution unit 5, the second process gas distribution unit 5b approximately matches the process gas distribution unit 5, and thus, its detailed description is omitted. The second process gas distribution unit 5b has a difference with the first process gas distribution unit 5a in that that the second process gas distribution unit 5b does not include the plasma electrode 58.

The second process gas distribution unit 5b may distribute the source gas to a source gas distribution area 50b (shown in FIG. 6). In this case, the substrates 10 supported by the substrate supporting unit 3 may pass by the source gas distribution area 50b according to the substrate supporting unit 3 rotating in the rotational direction (the R1 arrow direction). Therefore, the second process gas distribution unit 5b may distribute the source gas to the substrate 10 located in the source gas distribution area 50b. The source gas distribution area 50b may be located between the source process gas distribution unit 5b and the substrate supporting unit 3. In a case where the substrate processing apparatus 1 according to the present disclosure performs a deposition process of depositing a thin film on the substrate 10, the second process gas distribution unit 5b may be implemented to distribute the source gas including a thin film material which is to be deposited on the substrate 10.

The substrate processing apparatus 1 according to the present disclosure may be implemented so that the substrates 10 supported by the substrate supporting unit 3 sequentially pass by the source gas distribution area 50b and the reactant gas distribution area 50a according to the substrate supporting unit 3 rotating in the rotational direction (the R1 arrow direction). Therefore, the processing process may be performed on the substrates 10 supported by the substrate supporting unit 3 in the order of a source gas, plasma treatment using a reactant gas, a source gas, and plasma treatment using a reactant gas.

Although not shown, the substrate processing apparatus 1 according to the present disclosure may include a first purge gas distribution unit and a second purge gas distribution unit.

The first purge gas distribution unit may be installed in the chamber lid 4. The first purge gas distribution unit may distribute a purge gas toward the substrate supporting unit 3. Therefore, the first purge gas distribution unit may implement a purge function, and moreover, may divide a space between the substrate supporting unit 3 and the chamber lid 4 into a plurality of areas along the rotational direction (the R1 arrow direction). The first purge gas distribution unit may be installed in the chamber lid 4 so as to be located over the substrate supporting unit 3.

The first purge gas distribution unit may be installed in the chamber lid 4 at a position spaced apart from the second process gas distribution unit 5b along the rotational direction (the R1 arrow direction). Therefore, the first purge gas distribution unit may implement an air curtain between the source gas distribution area 50b and the reactant gas distribution area 50a, thereby spatially dividing the source gas distribution area 50b and the reactant gas distribution area 50a. Also, the first purge gas distribution unit may distribute the purge gas to the substrate 10 which has undergone the source gas distribution area 50b, thereby purging the source gas which remains without being deposited on the substrate 10. The first purge gas distribution unit may distribute an inert gas toward the substrate supporting unit 3 as the purge gas. For example, the first purge gas distribution unit may distribute argon toward the substrate supporting unit 3 as the purge gas.

The second purge gas distribution unit may be installed in the chamber lid 4. The second purge gas distribution unit may distribute the purge gas toward the substrate supporting unit 3. Therefore, the second purge gas distribution unit may implement a purge function, and moreover, may divide a space between the substrate supporting unit 3 and the chamber lid 4 into a plurality of areas along the rotational direction (the R1 arrow direction). The second purge gas distribution unit may be installed in the chamber lid 4 so as to be located over the substrate supporting unit 3.

The second purge gas distribution unit may be installed in the chamber lid 4 at a position spaced apart from the first process gas distribution unit 5a along the rotational direction (the R1 arrow direction). Therefore, the second purge gas distribution unit may implement an air curtain between the source gas distribution area 50b and the reactant gas distribution area 50a, thereby spatially dividing the source gas distribution area 50b and the reactant gas distribution area 50a. Also, the second purge gas distribution unit may distribute the purge gas to the substrate 10 which has undergone the reactant gas distribution area 50a, thereby purging the reactant gas which remains without being deposited on the substrate 10. The second purge gas distribution unit may distribute an inert gas toward the substrate supporting unit 3 as the purge gas. For example, the second purge gas distribution unit may distribute argon toward the substrate supporting unit 3 as the purge gas.

The second purge gas distribution unit and the first purge gas distribution unit may be implemented to be connected to each other. In this case, the second purge gas distribution unit and the first purge gas distribution unit may divide and distribute the purge gas supplied from one purge gas supply source. The second purge gas distribution unit and the first purge gas distribution unit may be provided as one body.

The present disclosure described above are not limited to the above-described embodiments and the accompanying drawings and those skilled in the art will clearly appreciate that various modifications, deformations, and substitutions are possible without departing from the scope and spirit of the invention.

The invention claimed is:

1. A substrate processing apparatus comprising:
a process chamber;
a substrate supporting unit installed in the process chamber to support a plurality of substrates;
a chamber lid covering an upper portion of the process chamber; and
a process gas distribution unit installed in the chamber lid to distribute a process gas toward the substrate supporting unit,
wherein
the process gas distribution unit comprises a distribution body installed in the chamber lid and a plasma electrode facing the substrate supporting unit, and
the plasma electrode comprises a first plasma electrode and a second plasma electrode, and the second plasma electrode is shorter than the first plasma electrode,
wherein the substrate supporting unit rotates about a rotational shaft,
wherein the process gas distribution unit comprises a plurality of first distribution holes, disposed along a first axis direction and spaced apart from one another, and a plurality of second distribution holes disposed along the first axis direction and spaced apart from one another,
wherein the distribution body comprises a first body, where the first distribution holes are provided, and a second body provided to protrude from the first body with respect to the first axis direction,
wherein the second body comprises a first sub-body provided to have a length, which is reduced in a direction toward the rotational shaft of the substrate supporting unit, in the first axis direction, and
wherein the second distribution holes are provided in the second body, and some second distribution holes, spaced apart from the first distribution holes by a long distance with respect to the first axis direction, of the second distribution holes are provided to have a shorter length in a second axis direction vertical to the first axis direction.

2. A substrate processing apparatus comprising:
a process chamber;
a substrate supporting unit installed in the process chamber to support a plurality of substrates;
a chamber lid covering an upper portion of the process chamber; and
a process gas distribution unit installed in the chamber lid to distribute a process gas toward the substrate supporting unit,
wherein
the process gas distribution unit comprises a distribution body installed in the chamber lid, a first injection hole through which a process gas which is to be distributed toward the substrate supporting unit is injected, and a second injection hole through which a process gas which is to be distributed toward the substrate supporting unit is injected, and
the first injection hole and the second injection hole are provided at different positions in the distribution body,
wherein the substrate supporting unit rotates about a rotational shaft,
wherein the process gas distribution unit comprises a plurality of first distribution holes, disposed along a first axis direction and spaced apart from one another, and a plurality of second distribution holes disposed along the first axis direction and spaced apart from one another,
wherein the distribution body comprises a first body, where the first distribution holes are provided, and a second body provided to protrude from the first body with respect to the first axis direction,
wherein the second body comprises a first sub-body provided to have a length, which is reduced in a direction toward the rotational shaft of the substrate supporting unit, in the first axis direction, and
wherein the second distribution holes are provided in the second body, and some second distribution holes, spaced apart from the first distribution holes by a long distance with respect to the first axis direction, of the second distribution holes are provided to have a shorter length in a second axis direction vertical to the first axis direction.

3. The substrate processing apparatus of claim 2, wherein the process gas distribution unit comprises:
a first branch groove connecting the first distribution holes and the first injection hole; and
a second branch groove connecting the second distribution holes and the second injection hole.

4. The substrate processing apparatus of claim 3, wherein the first distribution holes are provided in the distribution body along a first axis direction and are spaced apart from one another, and
the second distribution holes are provided in the distribution body along the first axis direction and are spaced apart from one another.

5. The substrate processing apparatus of claim 4, wherein the first distribution holes are disposed between the second distribution holes with respect to the first axis direction, and
the second distribution holes are disposed next to both sides of the first distribution holes with respect to the first axis direction so that a same number of second distribution holes and first distribution holes are located.

6. The substrate processing apparatus of claim 4, wherein the first distribution holes are provided to have a longer length than the second distribution holes with respect to the second axis direction vertical to the first axis direction, and
the first branch groove is connected to a smaller number of first distribution holes than number of second distribution holes connected to the second branch groove.

7. The substrate processing apparatus of claim 2, wherein the first injection hole is provided in an inner surface of the distribution body facing the rotational shaft of the substrate supporting unit, and
the second injection hole is provided in an outer surface located opposite to the inner surface of the distribution body.

8. The substrate processing apparatus of claim 2, wherein
the distribution body comprises an inner surface, facing the rotational shaft of the substrate supporting unit, and an outer surface located opposite to the inner surface, and
the outer surface is provided to configure a curved surface having a curvature center located near the rotational shaft of the substrate supporting unit.

9. The substrate processing apparatus of claim 8, wherein
the first distribution holes and the second distribution holes are provided in the distribution body,
a distance between the first distribution holes and the outer surface is the same as a distance between the second distributions holes and the outer surface.

10. The substrate processing apparatus of claim 2, wherein
the process gas distribution unit is provided in plurality in the chamber lid, and
a first process gas distribution unit among the process gas distribution units comprises a plasma electrode for generating plasma.

11. A gas distribution apparatus for substrate processing apparatuses, the gas distribution apparatus comprising:
a distribution body distributing a process gas toward a substrate supporting unit supporting a substrate;
a first injection hole provided in the distribution body, a process gas which is to be distributed toward the substrate supporting unit being injected through the first inject hole;
a second injection hole provided in the distribution body at a position spaced apart from the first injection hole, a process gas which is to be distributed toward the substrate supporting unit being injected through the second inject hole;
a plurality of first distribution holes, disposed along a first axis direction and spaced apart from one another; and
a plurality of second distribution holes disposed along the first axis direction and spaced apart from one another,
wherein the distribution body comprises a first body, where the first distribution holes are provided, and a second body provided to protrude from the first body with respect to the first axis direction,
wherein the second body comprises a first sub-body provided to have a length, which is reduced in a direction toward a rotational shaft of the substrate supporting unit, in the first axis direction, and
wherein the second distribution holes are provided in the second body, and some second distribution holes, spaced apart from the first distribution holes by a long distance with respect to the first axis direction, of the second distribution holes are provided to have a shorter length in a second axis direction vertical to the first axis direction.

12. The gas distribution apparatus of claim 11, comprising:
a first branch groove connecting the first distribution holes and the first injection hole; and
a second branch groove connecting the second distribution holes and the second injection hole.

13. The gas distribution apparatus of claim 12, wherein
the first distribution holes are disposed between the second distribution holes with respect to the first axis direction, and
the second distribution holes are disposed next to both sides of the first distribution holes with respect to the first axis direction so that a same number of second distribution holes and first distribution holes are located.

14. The gas distribution apparatus of claim 12, wherein
the first distribution holes are provided to have a longer length than the second distribution holes with respect to the second axis direction vertical to the first axis direction, and
the first branch groove is connected to a smaller number of first distribution holes than number of second distribution holes connected to the second branch groove.

15. The gas distribution apparatus of claim 11, wherein
the first injection hole is provided in an inner surface of the distribution body facing the rotational shaft of the substrate supporting unit, and
the second injection hole is provided in an outer surface located opposite to the inner surface of the distribution body.

16. The gas distribution apparatus of claim 11,
wherein the distribution body comprises an inner surface, facing a rotational shaft of the substrate supporting unit, and an outer surface located opposite to the inner surface,
the outer surface is provided to configure a curved surface having a curvature center located near the rotational shaft of the substrate supporting unit, and
wherein the first distribution holes and the second distribution holes are provided in the distribution body a distance between the first distribution holes and the outer surface is the same as a distance between the second distributions holes and and the outer surface.

17. The gas distribution apparatus of claim 11, comprising: a plasma electrode for generating plasma,
wherein the plasma electrode is installed in the distribution body.

* * * * *